(12) United States Patent
Keller

(10) Patent No.: US 6,504,159 B1
(45) Date of Patent: Jan. 7, 2003

(54) SOI PLASMA SOURCE ION IMPLANTATION

(75) Inventor: John H. Keller, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/395,417

(22) Filed: Sep. 14, 1999

(51) Int. Cl.$^7$ .......................... H01J 27/00; H01J 37/30
(52) U.S. Cl. ............................ 250/423 R; 250/492.21; 315/111.81
(58) Field of Search ........................... 250/492.21, 398, 250/423 R; 315/111.81

(56) References Cited

U.S. PATENT DOCUMENTS

| | | | |
|---|---|---|---|
| 4,447,732 A | * 5/1984 | Leung et al. | 250/427 |
| 4,764,394 A | 8/1988 | Conrad | |
| 4,788,473 A | 11/1988 | Mori et al. | |
| 5,013,401 A | 5/1991 | Samakawa et al. | |
| 5,212,425 A | 5/1993 | Goebel et al. | |
| 5,238,849 A | * 8/1993 | Sato | 437/32 |
| 5,393,986 A | * 2/1995 | Yoshinouchi et al. | 250/492.21 |
| 5,436,175 A | 7/1995 | Nakato et al. | |
| 5,449,920 A | * 9/1995 | Chan | 250/492.21 |
| 5,483,077 A | * 1/1996 | Glavish | 250/396 R |
| 5,498,290 A | 3/1996 | Matossian et al. | |
| 5,558,718 A | 9/1996 | Leung | |
| 5,563,418 A | * 10/1996 | Leung | 250/492.21 |
| 5,654,043 A | 8/1997 | Shao et al. | |
| 5,661,043 A | 8/1997 | Rissman et al. | |
| 5,891,252 A | 4/1999 | Yokogawa et al. | |

* cited by examiner

Primary Examiner—Bruce Anderson
(74) Attorney, Agent, or Firm—Jay H. Anderson; Whitham, Curtis & Whitham

(57) ABSTRACT

A well-defined buried layer is developed in a body of semiconductor material such as a wafer at high throughput and without developing non-annullable crystal lattice defects at a surface of the body of semiconductor material using a broad, substantially uniform ion beam, preferably provided by an electron-cyclotron resonance or bucket or multi-pole plasma source, which is allowed to produce ionization only when a stable acceleration voltage is present to provide a narrow spread of ion energies. High purity of ion population in the ion beam is provided by employing a high level of vacuum (e.g. fractions of a microTorr) in the implantation vessel or ion source and introducing ionizable material in substantially pure form. Thus mass analysis of the beam is unnecessary for implantation of only a desired ion species. A magnetic filter may be employed to adjust relative populations of ion species. Arc breakdown can be avoided by increasing the length of the ion beam extraction column so that the. implantation process can be conducted at a high duty cycle or even continuously.

25 Claims, 5 Drawing Sheets

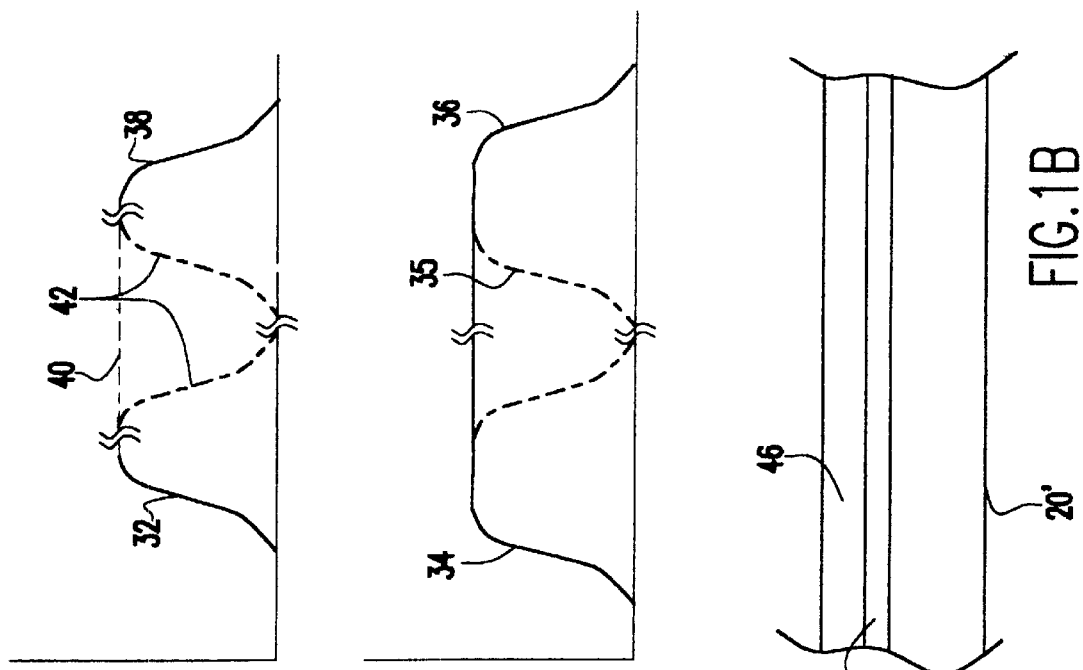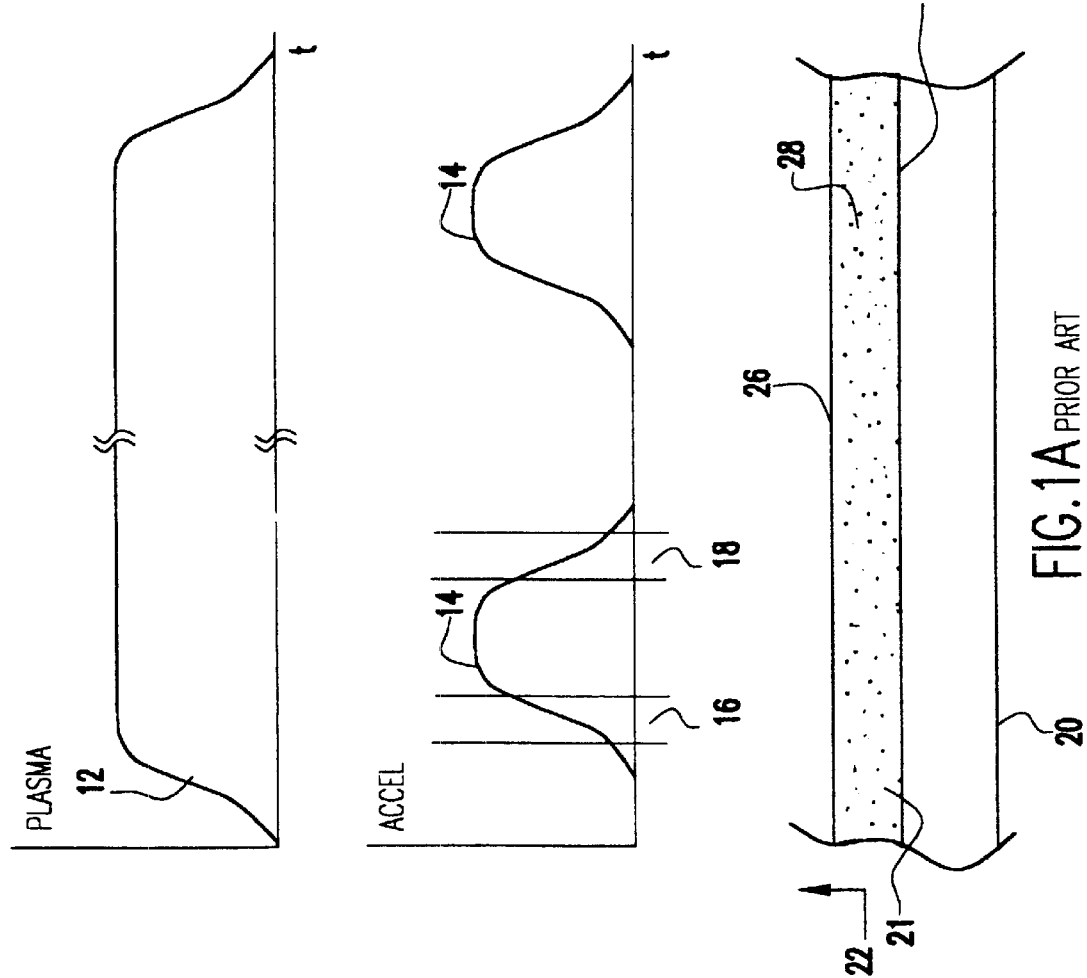

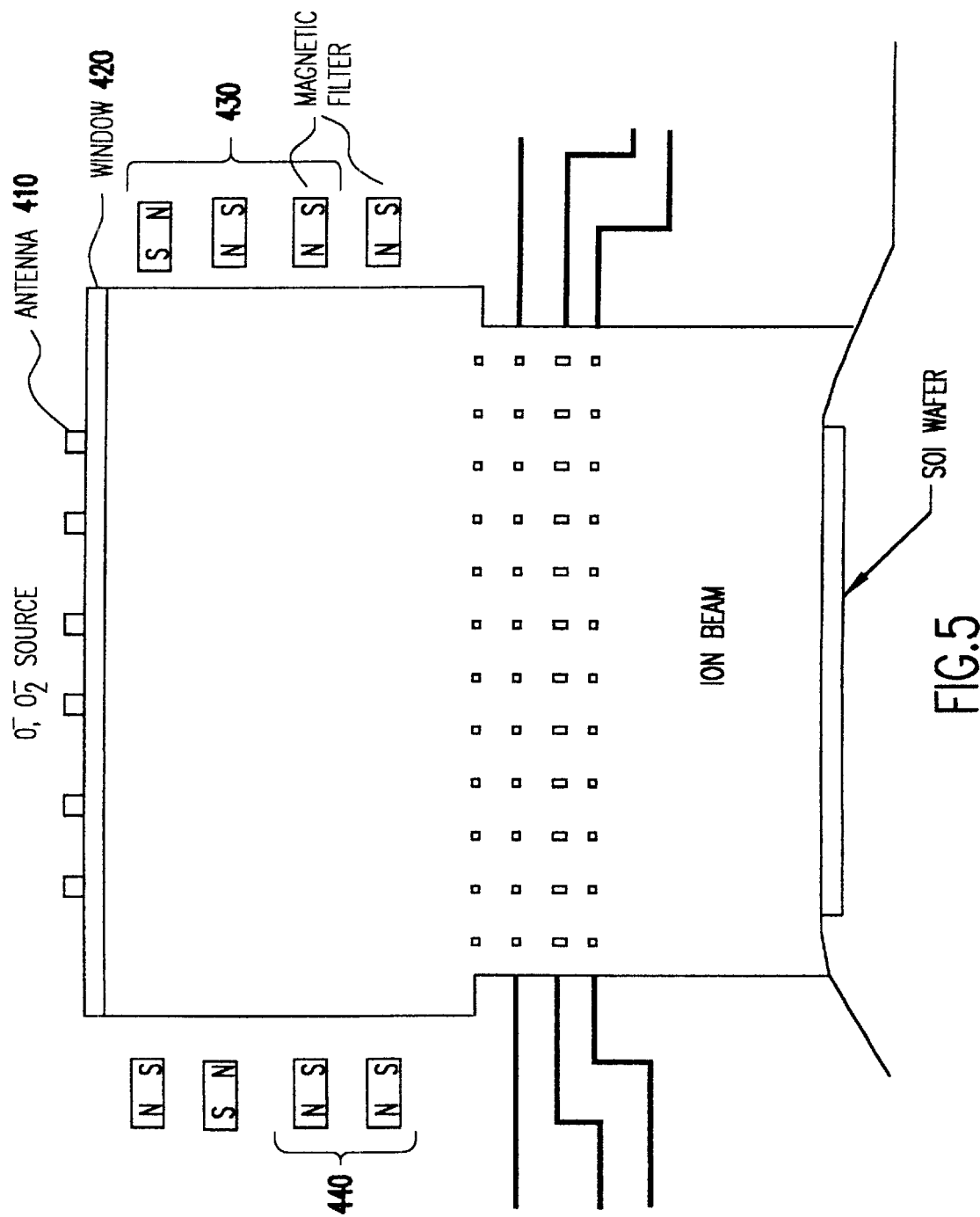

SOI PLASMA SOURCE ION IMPLANTATION

BACKGROUND OF THE INVENTION

1. Field of the Invention

The present invention generally relates to ion implantation processes for manufacture of semiconductor integrated circuit devices and, more particularly, to ion implantation for creating buried layers such as silicon-on-insulator (SOI) substrates.

2. Description of the Prior Art

The art of semiconductor electronic device manufacture has become highly sophisticated in recent years to provide a wide range of electrical properties of the devices, often at very high integration density. The capability to determine the electrical properties with high reliability, consistency and manufacturing yield is often limited, as a practical matter, by the tools used for processing the semiconductor material, usually in the form of a wafer. Such tools are often complex and of high precision. Therefore such tools are generally expensive to build and maintain. The principal expense of modern semiconductor devices is thus a portion of the cost of the tools used to produce them and, therefore, varies inversely with tool throughput. Of course, tool cost of each manufactured unit also is proportional to the cost and complexity and maintenance costs of each of the tools used in its fabrication.

An example of such a process is formation of semiconductor-on-insulator (SOI) substrates. SOI structures can be created by depositing or growing an insulator, (e.g. oxide) on a substrate followed by epitaxial growth or deposition of a further layer of semiconductor. Annealing may be required to develop a monocrystalline structure in the further semiconductor layer. This process is complex, proceeds slowly (and is thus expensive) and is of relatively low yield (further increasing unit cost) since the monocrystalline layer must be substantially free of crystal lattice dislocations; a quality which is difficult to achieve over oxide.

A preferred technique is to form the insulator by implantation of ions into a monocrystalline wafer such that the oxygen ions combine with the substrate material at a desired depth within the wafer to form the buried insulator while leaving the surface monocrystalline layer substantially intact. However, to obtain an ion beam of sufficient purity (e.g. free of ions of other than an intended element or radical) mass analysis is often employed and results in loss of a large fraction of the beam current.

Basically, mass analysis involves passing the ion beam through a dipole magnetic field established across a small gap. Assuming substantially the same velocity of the charged particles in the ion beam, the magnetic field will exert a force on each ion in a direction in accordance with the charge thereon perpendicular to both the direction of motion and the magnetic field. This force results in an acceleration inversely proportional to the square root of the ion (or electron) mass and ions having differing charge or differing mass are placed on different trajectories. Thus, undesired ions can be intercepted and removed from the ion beam resulting in a beam populated by only identical ions.

However, this process also causes loss of significant populations of desired ions from the beam through several mechanisms such as spreading of the beam within the dipole magnet in the direction of the pole pieces such that a significant number of ions strike the faces thereof. Further, the mass analysis process results in a beam of relatively small cross-section which must be scanned across the wafer or workpiece and electrical or magnetic deflection of the ion beam results in further loss of ions from the mass-analyzed beam by similar mechanisms. Perhaps most significantly for oxygen (which is the material of choice for forming SOI structures), ions may be produced in several forms which will be affected differently by the mass analysis process: $O^-$ and $O^+$ ions will be separated by charge (and, generally, velocity) and $O^-$ and $O_2^-$ ions will be separated by mass.

Accordingly, due to the relatively low beam current and the relatively high concentration of ions which must be delivered to form an insulator of significant thickness and adequate integrity, the ion implantation process proceeds slowly and throughput is very low, resulting in very high tool costs which dominate the unit cost of SOI structures. It is estimated that an 80% reduction in such costs could be achieved through increase of ion beam current. Moreover, while SOI structures are known to have some important performance advantages over other known semiconductor technologies, those advantages cannot be economically exploited without achievement of a substantial portion of that cost reduction.

In an effort to obtain increased ion beam currents (and wider beam cross-section to require, at most, mechanical scanning to avoid loss of ions to electrical or magnetic deflection arrangements), a technique referred to as plasma source ion implantation (PSII) has been developed. This technique involves production of a plasma near or in contact with a surface of a workpiece and pulsing a voltage between the workpiece and the plasma to accelerate the ions to achieve the desired implantation energy and implantation depth.

Pulsing of the accelerating voltage is necessary in order to avoid arc breakdown between the workpiece and the plasma. Pulsing, of course, also reduces the duty cycle of the implantation process and thus limits the speed at which the implantation process could proceed. In general, the time period between pulses cannot be reduced beyond a particular limit determined by other parameters of the process such as ion and electron mobility in order to avoid arc breakdown.

Unfortunately, this technique has been found unsuitable for forming SOI structures since it causes excessive damage to the crystal lattice near the surface of the workpiece beyond practical recovery through subsequent annealing. It has been theorized (see "Boron Doping of Silicon by Plasma Source Implantation" by R. J. Matyi et al., Surface and Coating Technology 93 (1997), pp. 247–253) that the damage is due to ions implanted at the beginning and end of the accelerating voltage pulse having lower energy and which are thus implanted at reduced depth. This observation also implies that PSII would also be unsuitable for producing any buried layer in which the concentration of buried layer material in the overlying layer is at all critical to intended device function (e.g. a buried conductive plate in a memory device). Some damage may be done in the surface layer by contact with the plasma, as well.

Electron-cyclotron resonance (ECR) plasma sources are known in the art and operate well at relatively high vacuum levels. In these sources microwave energy is projected through a dielectric window to form an electromagnetic wave in a plasma chamber in which a strong magnetic field is present. A gas to form the plasma is introduced at an inlet and, as the gas is ionized, electrons are directed in circular trajectories around the magnetic field lines. When the electrons are rotating with the same frequency as the microwave power, the microwave power increases their energy. The electrons will absorb more energy at high vacuum (fractions of a mTorr) since fewer collisions will occur. Therefore, ECR plasma sources are used to facilitate generation of a plasma.

Also, due to the high energy of electrons in the ECR system, molecules of gases from which the plasma is formed are readily cracked to their atomic species. It should be recognized that the number of ions striking the chamber, being neutralized, returning to the gas and again being ionized is many times greater than the number of molecules (or atoms) of gas provided to the plasma/reaction chamber. Therefore, there will be many collisions between high energy electrons and gas molecules or molecular ions (e.g. $O_2^+$) to cause gas cracking. It is also known that, by virtue of this mechanism of cracking of molecules of gases, when oxygen is used to form the plasma that a preponderance of $O^+$ ions will be produced.

Plasma sources with surface magnetic fields are also known and generally referred to as "bucket" sources. These plasma sources may also be driven with inductively coupled power In these sources, the electric field is produced by an antenna at the dielectric window. A magnetic field is provided at the surface of the plasma generation chamber by alternating polarity pole pieces surrounding the chamber. The plasma generation action is similar to the ECR plasma source described above except that the electrons are not resonant around magnetic field lines.

It should also be recognized that use of a high vacuum with either of the sources allows undesired materials to be largely removed from the plasma. That is, the reaction chamber is substantially evacuated and the desired material for the plasma introduced into the chamber, usually in a highly pure form. Further, a number of known filtration arrangements are known and can be used in the path of the gas from the source to the reaction chamber inlet to remove particular contaminants such as moisture. Therefore, a plasma can be provided which is substantially free of ions of contaminant materials.

Additionally, it is known to provide a magnetic filter in a plasma chamber to further increase O− and $O_2^-$ production. When oxygen is used to form the plasma, $O^-$ and $O_2^-$ ions can be preferentially produced by a bucket source with a magnetic filter.

Magnetic filters are generally formed by a structure which provides a magnetic field across the path along which ions are extracted from the plasma. A permanent magnet or electromagnet in the form of a rod within the chamber, permanent magnets or electromagnets placed with poles of opposite polarity across the chamber or a high current between apertures of a multi-aperture extraction grid are examples of known structures that can function as magnetic filters. In this regard, it should be appreciated that early ECR plasma sources used for ion implantation used an apertured extractor and produced a narrow beam since broad sources are difficult to mass analyze and tend to develop overlapping patterns of ion species across broad targets.

While ECR and bucket sources can produce high density plasmas of relatively high purity even without use of a magnetic filter, their principal application in semiconductor processes is for surface treatments such as deposition or etching rather than implantation. In fact, such sources can be used for a PSII process as discussed above to improve purity of the population of ions produced and implanted. However, no solution has been found for the unacceptable amount of crystal lattice damage which results from broadened ion energy distribution during pulsed implantation to form a buried layer which is characteristic of PSII processes. Otherwise, only marginal increases in ion beam current and beam width can be achieved within the present state of the art and which do not support significant increases in tool throughput and cost reduction.

SUMMARY OF THE INVENTION

It is therefore an object of the present invention to provide a plasma tool which is capable of producing a large current of ions of high purity and of limited distribution of energies.

It is another object of the invention to provide a technique of ion implantation which proceeds with greatly enhanced speed and a tool with which the technique can be practiced.

It is a further object of the invention to provide a tools and method for producing SOI substrates and other structures having a sharply defined buried layer with high throughput and at low tool cost.

It is yet another object of the invention to provide a simplified and space-efficient ion implantation tool.

It is another further object of the invention to provide a tool and technique of ion implantation which proceeds with substantially increased speed and can be performed continuously.

In order to accomplish these and other objects of the invention, a method of forming a buried layer in a body of semiconductor material is provided including steps of providing an acceleration voltage corresponding to a desired depth of the buried layer within the body of semiconductor material adjacent a source of ions, and ionizing a material subsequent while the acceleration voltage is present to provide a narrow and well-controlled distribution of ion implantation energies.

In accordance with another aspect of the invention, an ion implantation apparatus is provided including an ion source, an arrangement for applying an accelerating voltage field adjacent the ion source, and an arrangement for controlling said ion source, to provide ions only when said acceleration voltage field is present adjacent said ion source.

In accordance with a further aspect of the invention, a semiconductor structure such as a semiconductor-on-insulator wafer is provided having a well-defined buried layer formed from a first species of ions of an implanted material wherein a second species of ions of the implanted material are implanted at a depth beyond the buried layer.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A and 1B are timing diagrams contrasting the invention with a known PSII process, FIG. 5 is a schematic sectional view of a plasma tool in accordance with a fourth embodiment of the invention.

DETAILED DESCRIPTION OF A PREFERRED EMBODIMENT OF THE INVENTION

Figure 2:
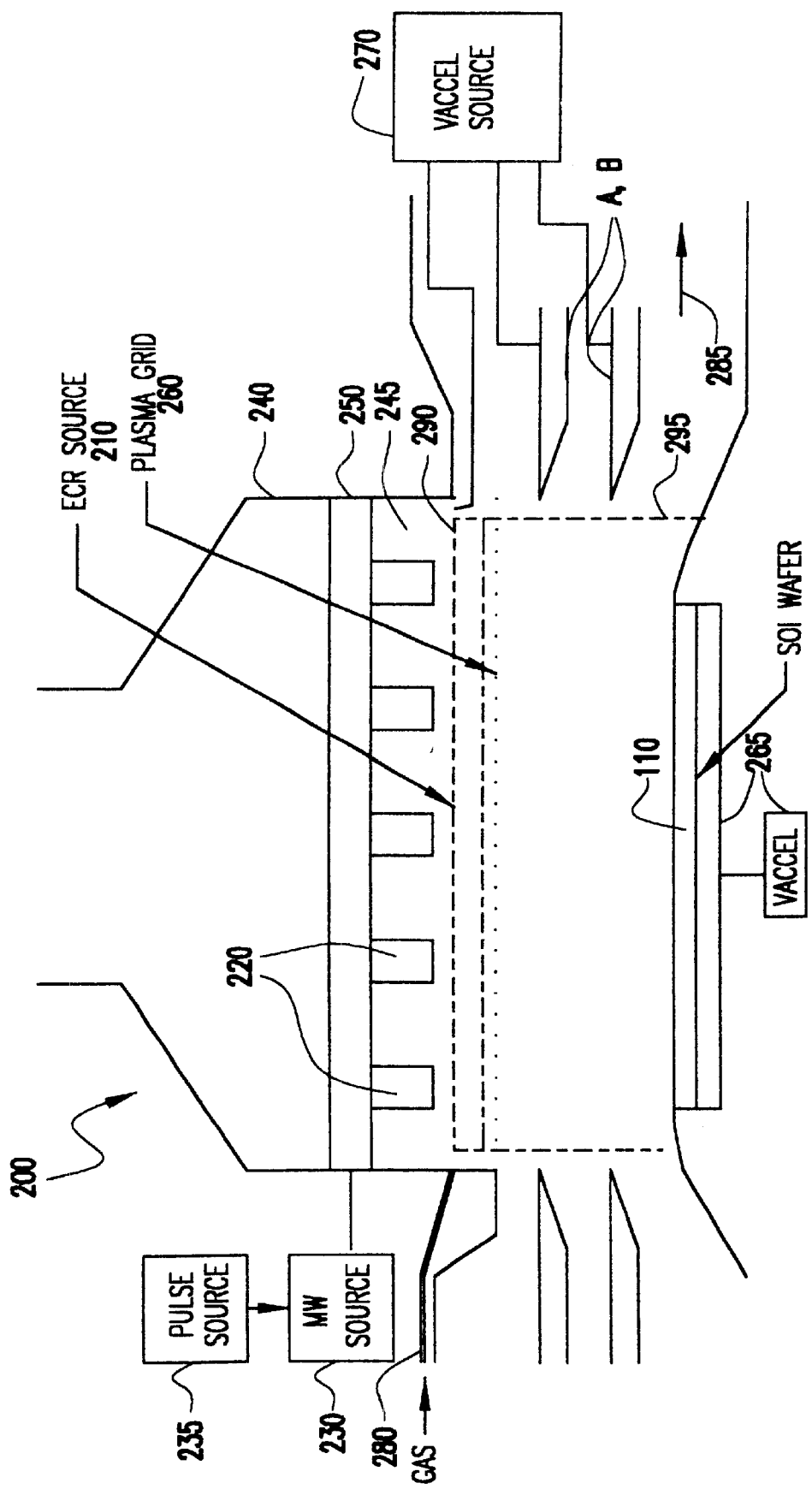
FIG. 2 is a schematic sectional view of a plasma tool in accordance with a first embodiment of the invention.

Referring now to the drawings, and more particularly to FIGS. 1A and 1B, there is shown timing diagrams which contrast one feature of the invention with the known PSII process. FIG. 1A represents the PSII process and is labelled Prior Art. It should be understood that FIG. 1B will be discussed as it reflects a particular case of the operation of the invention in the interest of clarity and the generalized waveforms illustrated are simplified for this purpose. The section lines in FIG. 1B are intended to reflect a more general case of the operation of the invention.

As alluded to above, the PSII process provides a plasma adjacent to or in contact with the surface of a wafer into which ions are to be implanted. An accelerating voltage is pulsed to draw ions from the plasma and impart a desired amount of energy to them in accordance with a desired implantation depth. That is, as shown in FIG. 1A, the plasma is initiated 12 prior to pulsing of the accelerating voltage (e.g. 14) and maintained throughout the implantation process including numerous accelerating voltage pulses intervening between the first and last pulses illustrated. A PSII process can also be performed by pulsing inlet gas when ionization and acceleration voltages are present but significant non-uniformities of ion density are produced and gas pulsing is not well-suited to forming a buried layer for that reason.

As can readily be appreciated, pulsing of the accelerating voltage or the inlet gas, which is critical to avoid arc breakdown interrupts the implantation process for significant periods of time and the process speed is, accordingly, reduced. Therefore, even the potential to increase tool throughput is necessarily limited.

More importantly, since the workpiece, such as a wafer, to which the accelerating voltage is applied necessarily has some finite (and often relatively large) capacitance to the plasma, the rise and fall times of the accelerating voltage are also unavoidably finite, as shown at 16 and 18 and result in extraction of ions having reduced energy during those periods. This effectively increases the spread of the energy distribution of ion energies over each pulse and shallow implantation of ions extracted during these periods. Accordingly, a gradient of material concentration of implanted ions 21 is developed in wafer 20 as indicated by arrow 22 (pointing in the direction of decreasing concentration) and will extend from the maximum intended depth 24 to the surface 26 of the wafer.

The implantation of ions near the surface 26 is believed to result in observed and excessive crystal lattice damage 28 at surface 26. Further, this damage is not correctable through practical annealing process due to the presence of a significant concentration of ions near the surface (which would increase by diffusion during extended annealing). Therefore, PSII is not a suitable process for fabrication of SOI structures with require nearly complete freedom from non-anneallable crystal lattice defects (e.g. crystal lattice defects that cannot be repaired by annealing) at surface 26 or structures which require a well-defined boundary at an upper side of a buried layer.

Figure 4:
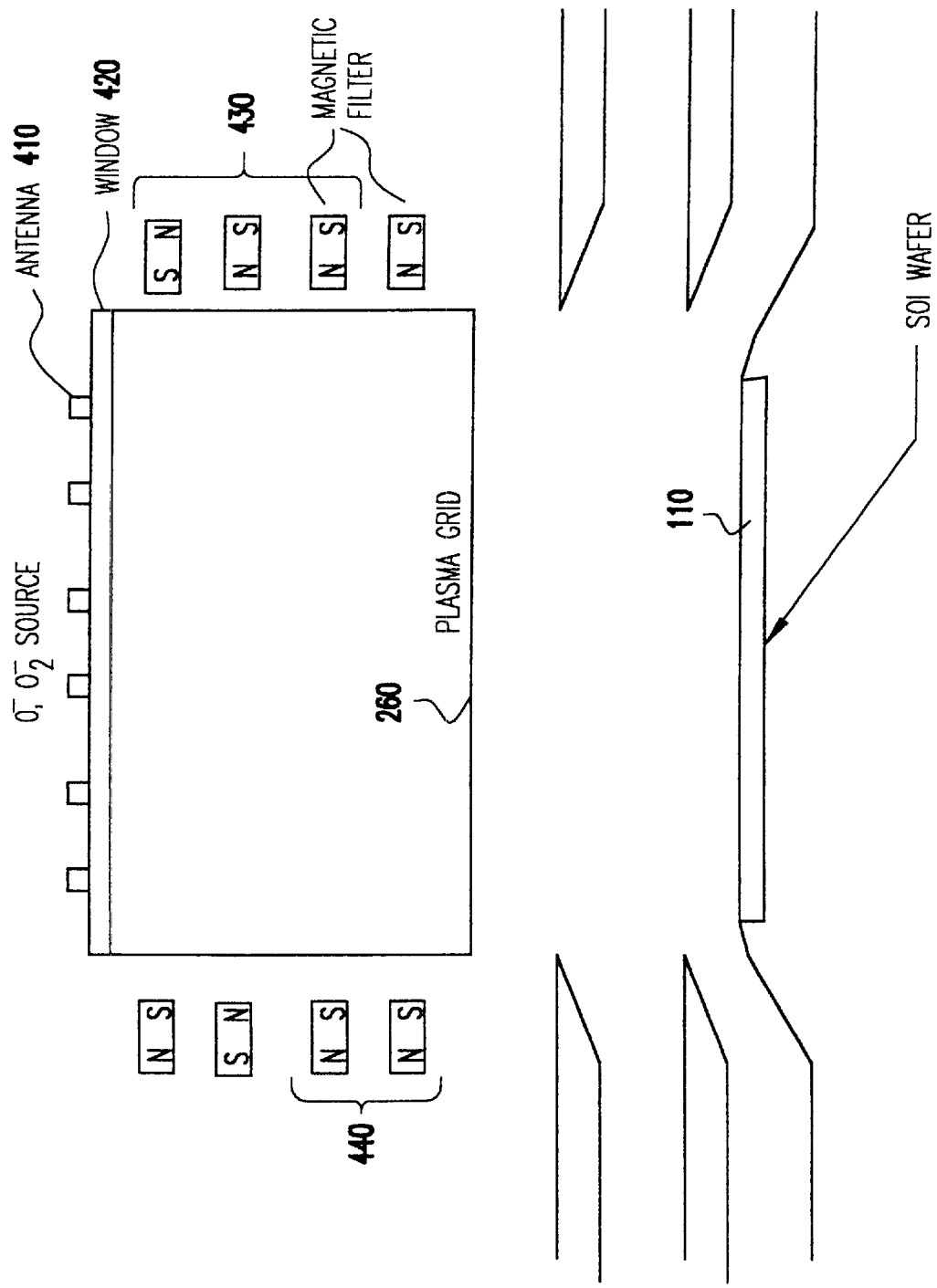
FIG. 4 is a schematic sectional view of a plasma tool in accordance with a third embodiment of the invention.

Referring now to FIG. 1B, one feature of the invention which avoids crystal lattice damage is to reverse the order of application of accelerating voltage and the generation of a plasma as shown at 32 and 34 and to maintain the accelerating voltage beyond the time of termination. of the plasma as shown at 36 and 38. (Additionally, a plasma grid 250, as shown in FIGS. 2 and 4 may be provided and used to prevent the accelerating voltage from interfering with the generation of the plasma.) The plasma may be continuously maintained (40) or pulsed (dashed lines 42) during the implantation process as may be dictated by the geometry of the implantation tool, as will be discussed below or made desirable by other incidents of a particular process which are not important to the practice of the invention in accordance with its basic principles.

By providing a stable (e.g. preferably constant but possibly variable over a limited range) accelerating voltage at all times that a plasma can exist, a known accelerating voltage substantially unaffected by rise and fall times (34, 36) of the accelerating voltage signal will be provided for all ions formed in the plasma and are available to be drawn therefrom. Thus all ions drawn from the plasma will have a known energy (or distribution of energies) imparted thereto. The distribution of energies will thus not be broadened, particularly at the low energy side of the energy distribution by transients 16 and 18 of the accelerating voltage. Therefore, a sharply defined buried layer 44 can be formed in wafer 20' with little or no damage or ion concentration in the surface layer 46.

Referring now to FIGS. 2–5, four exemplary embodiments of the invention will be discussed. As introduction, it should be noted that FIGS. 2 and 3 utilize ECR plasma sources while FIGS. 4 and 5 utilize multi-pole or bucket negative ion plasma sources, both alluded to above. Additionally, as a perfecting feature of the invention FIGS. 4 and 5 illustrate inclusion of a magnetic filter which is preferred but not necessary to the practice of the invention in accordance with its basic principles.

Figure 3:
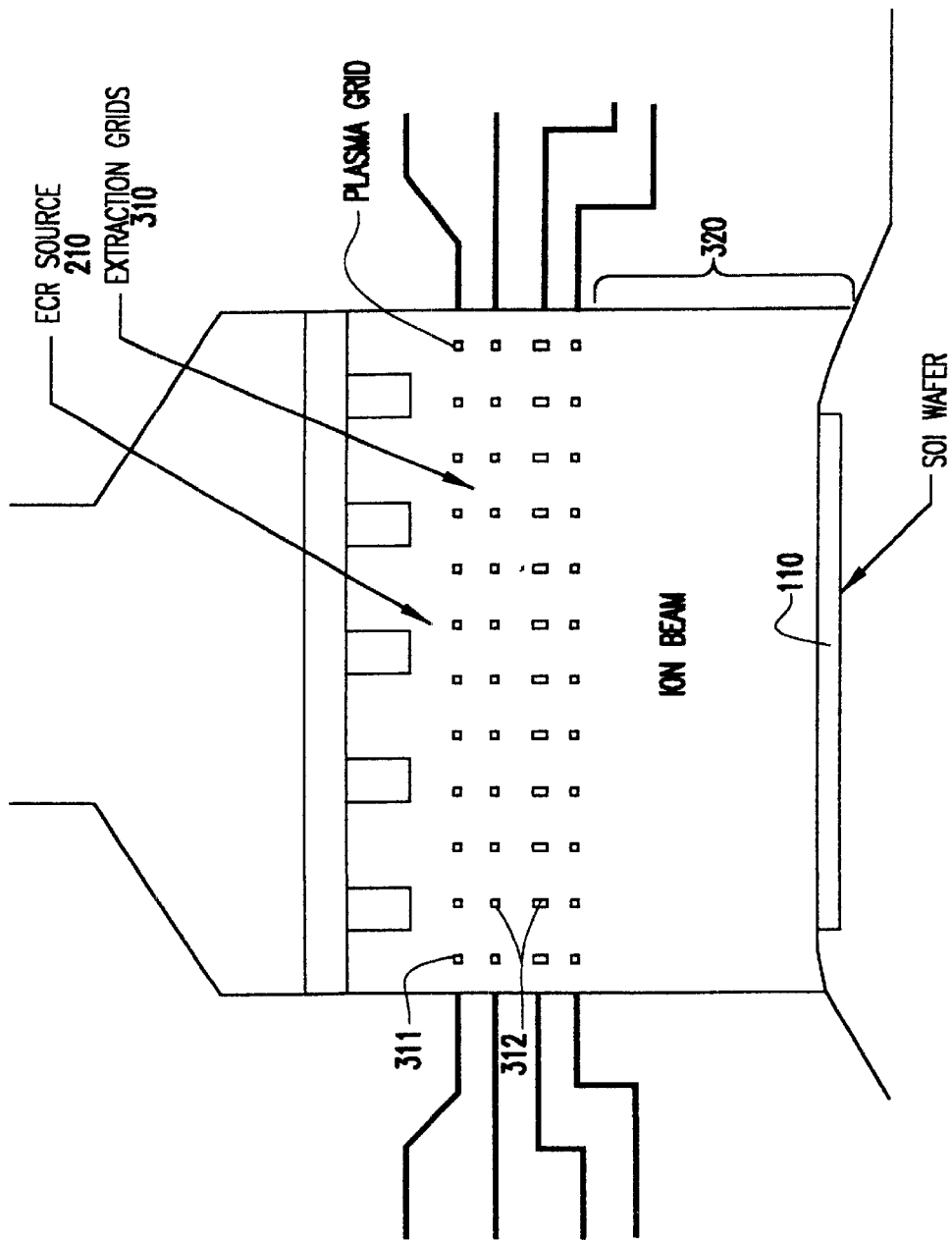
FIG. 3 is a schematic sectional view of a plasma tool in accordance with a second embodiment of the invention.

Further, FIGS. 2 and 4 illustrate a simplified reaction chamber or vessel of reduced dimensions (although scalable to correspond to the area of one or more wafers to be concurrently processed but which requires pulsing of the plasma while FIGS. 3 and 5 depict a reaction chamber or vessel of only slightly increased complexity and size which in capable of performing ion implantation continuously until complete and which is capable of further increased throughput. On the other hand, the embodiments of FIGS. 2 and 4 are capable of increased plasma density and increased beam current and are thus capable of performing implantation at a higher rate during acceleration voltage pulses. Therefore, the ultimate throughput for either chamber design and, especially, tool cost per unit produced may be quite comparable in view of the difference in tool complexity and size.

FIG. 2 shows a schematic cross-sectional depiction of a reaction chamber or vessel 200 in accordance with a first embodiment of the invention. This first embodiment is characterized as having an ECR plasma source 210, generally as described above, the details of which are not generally important to the practice of the invention and which will be evident to those skilled in the art in view of the following description of the operation thereof. The particular ECR source depicted is a distributed ECR source having a plurality of resonant zones. ECR plasma source 210 includes a source of a strong magnetic field (e.g. about 800 to 1000 Gauss for 2.45 GHz), schematically depicted as magnet pieces 220. A source of microwave energy 230 is provided and connected to waveguide 210 through a dielectric window 250. The source of microwave energy is controlled responsive to a pulse source 235.

In order to reduce contamination to minimal levels, the chamber should be capable of being pumped down to an ultra-high vacuum (e.g. a pressure of a fraction of a microTorr or less) and preferably capable of being baked. When the chamber is evacuated to a high vacuum (e.g. a fraction of a mTorr or lower) through an outlet indicated by arrow 285, a small amount of reactant gas supplied at inlet 280 and microwave energy is applied, a plasma will be rapidly generated and will partially fill the plasma chamber 245, as depicted by dashed line 290. However, a feature of the invention provides for application of an acceleration voltage between source 200 and wafer electrode 265 (and possibly other electrodes that may be provided as shown at A, B, to increase beam uniformity). in order to draw ions from the plasma and impart a known energy thereto.

When ionization to form the plasma begins, any ions formed and which are drawn from the developing plasma will be accelerated to substantially the same energy, regardless of the instantaneous density of the plasma. (In addition to preventing the acceleration voltage. from interfering with plasma generation, a plasma grid, if provided, may also be used to establish a starting surface of the beam and may be flat or of any desired shape to accommodate such a function.) Thus, the ions will form a broad beam as indicated by dashed line 295.

Since a known and stable acceleration voltage is applied to draw ions from the plasma and accelerate them to a desired energy at all times that ions are present during the implantation process, the distribution of ion energies can be maintained very narrow. Electrodes A, B may also be advantageously utilized in this regard by choice of voltage applied thereto, particularly for ion trajectory regulation. Accordingly, a well-defined range of depth of implanted ions can be achieved without excess crystal lattice damage as depicted in FIG. 1B as compared to the result of a PSII process depicted in FIG. 1A.

It should be noted that ion beam 295 and the distance from the plasma chamber (e.g. bounded by the plasma grid 260) is relatively short in the embodiment of FIG. 2. The embodiment of FIG. 2 is also quite simple and easily constructed at limited cost as well as being of relatively small volume and outer dimensions relative to the size of the beam and wafer area 110. However, the relatively short ion beam column length and the proximity between the workpiece(s) 110 and plasma source may allow arc breakdown to occur; depending on the process parameters and the particulars of the reaction vessel 200 although arc breakdown is substantially limited or suppressed relative to a PSII process by the separation of the ion source from the workpiece. If arc breakdown is likely, or is found to occur, it can be prevented by pulsing (or reducing the duty cycle of pulsing) of the plasma. While interruption of the implantation process in this way increases processing time, the overall tool cost may be partially or fully compensated by some increase in ion current and significant reduction in tool complexity and cost of construction and maintenance.

Referring now to FIG. 3, a reaction chamber in accordance with a second embodiment of the invention is schematically shown in cross-section in a manner similar to that of FIG. 2. As in FIG. 2, an ECR source 210 is provided and need not be described further. Microwave source 230, acceleration voltage source 270 and the inlet and outlet 280, 285 are not illustrated in FIG. 3 in the in the interest of clarity.

The principal differences between the embodiment of FIG. 3 and that of FIG. 2, discussed above, are that a plurality of extraction grids 310 are provided, forming a multi-aperture extractor, and the ion beam column length 320 is increased. By doing so, many problems with ion trajectory are resolved and electrodes A, B, are preferably replaced by second and third grids 312. Further, the multi-aperture extractor allows the plasma source and the extracted ion beam to be expanded to substantially the full cross-sectional area of the reaction chamber with good ion flux uniformity and energy. Perhaps most importantly, the increased ion beam extraction column length 320 prevents arc breakdown and allows the ion implantation process to be continuously conducted until complete to maximally increase throughput even though the ion density is somewhat lowered relative to the embodiment of FIG. 2.

It should be recognized the function of the extraction grids 310 may function more to blank the beam than the embodiment of FIG. 2 in which the principle function of plasma grid 260 was to extract ions from the plasma. Thus the timing of the development of the plasma and the provision of the acceleration voltage are less critical (e.g. the plasma may be developed prior to the provision of an accelerating voltage) but the principle explained above with reference to FIG. 1B remains that the beam should be interrupted except during times in which the accelerating voltage is stable.

To summarize the embodiments of FIGS. 2 and 3, both use an ECR plasma source which provides a substantially pure source of $O^+$ ions. A minor trade-off is presented between column length, tool cost and complexity, size, beam current at the target and the susceptibility to arc breakdown. Therefore, the embodiments of these Figures should be regarded as exemplary among a continuum of design considerations, grid and electrode configurations and dimensions. Nevertheless, both provide greatly increased throughput for manufacturing structures with buried layers at much reduced tool costs and without surface damage associated with PSII processes. These or other plasma sources could be used at higher pressures to produce dominantly $O_2^+$ ion while acceleration voltage could be increased to impart desired energy per ion. In such a case $O^+$ or $O^{++}$ contaminant ions are implanted deeper (i.e. below the insulator layer) and thus are not of concern.

Referring now to FIG. 4, a reaction vessel in accordance with a third embodiment of the invention is shown in a manner similar to that of FIG. 2. The principal difference between the embodiment of FIG. 4 and that of FIG. 2 is the use of a bucket or multi-pole ion source rather than an ECR source. Accordingly, elements common to both FIGS. 2 and 4 need not be further discussed.

Bucket or multi-pole ion sources have been discussed above. High frequency energy is inductively-provided by an antenna 410 adjacent a dielectric window 420. The source of high frequency power is not shown in the interest of clarity. In this type of plasma source, as contrasted with the ECR plasma source of FIGS. 2 and 3 a plurality of magnetic poles are provided in an alternating manner over region 430 to provide magnetic confinement of the plasma over a region near the vessel walls in order to enhance plasma density. The source pressure can be varied to alter proportionate production of $O^-$ and/or $O_2^-$ ions.

As a perfecting feature of the invention, further magnetic poles are provided in region 440 of the bucket plasma source in a manner to reinforce the field of the lowermost magnetic poles in region 430 to form a magnetic filter. The magnetic filter functions to reduce the population of hot electrons and allow production of $O^-$ and $O_2^-$ ions.

A reaction chamber in accordance with a fourth embodiment of the invention is shown in FIG. 5. This embodiment is similar to that of FIG. 3 but employs a bucket plasma source similar to that of FIG. 4 rather than an ECR source. Therefore, the elements which are common to either of the embodiments of FIG. 3 or FIG. 4 need not be discussed further. Again, the increased length of the multiple aperture extraction column prevents arc breakdown and the implantation process can be conducted continuously until complete. Similarly, FIGS. 4 and 5 represent exemplary variants among a continuum of design parameters which may be chosen as do the embodiments of FIGS. 2 and 3 when considered in association therewith.

In view of the foregoing, it is seen that the invention provides a plasma tool and technique by which ion implantation can be performed at high speed and greatly improved throughput. The reduced complexity and construction and maintenance costs of vessels in accordance with the invention further serve to reduce per unit cost of structures produced thereby, such as SOI structures. The implantation process performed using such tools, together with anneal cycles, forms a well-defined buried layer without incurring unacceptable surface damage characteristic of PSII processes. High purity of implanted material is provided by high-vacuum in combination with bucket or ECR plasma sources so that mass-analysis in a narrow dipole gap and the ion loss from the ion beam which is associated with such mass analysis can be avoided.

While the invention has been described in terms of several preferred embodiments, those skilled in the art will recognize that the invention can be practiced with modification within the spirit and scope of the appended claims. For example, to provide a buried layer with well-defined boundaries, such as transistors with reduced capacitance to the substrate and greater radiation hardness or a common capacitor plate for a plurality of storage cells in a memory device, the process and apparatus could be employed with many other materials appropriate to the formation of either conductors or insulators.

Having thus described my invention, what I claim as new and desire to secure by Letters Patent is as follows:

1. A method of forming a buried layer in a body of semiconductor material, said method including the steps of:
   providing a source of ions;
   providing an acceleration voltage adjacent said source of ions, the acceleration voltage corresponding to a desired depth of said buried layer within said body of semiconductor material; and
   providing ionizing energy to a gaseous material within said source of ions, said ionizing energy being provided only when said acceleration voltage is present adjacent said ion source.

2. A method as recited in claim 1, wherein said gaseous material is oxygen.

3. A method as recited in claim 1, further comprising the step of
   preventing interference of said step of providing an acceleration voltage with said step of providing ionizing energy by using a grid.

4. A method as recited in claim 3, further comprising the step of providing an electrode connected to said body of semiconductor material, and wherein in said step of providing an acceleration voltage, said acceleration voltage is applied between said ion source and said electrode.

5. A method as recited in claim 3, wherein said acceleration voltage is applied to the grid.

6. A method as recited in claim 1, further comprising the step of providing an electrode connected to said body of semiconductor material, and wherein in said step of providing an acceleration voltage, said acceleration voltage is applied between said ion source and said electrode.

7. A method as recited in claim 1, wherein said step of providing an acceleration voltage further comprises providing a grid, and said acceleration voltage is applied to the grid.

8. A method as recited in claim 1, wherein said step of providing ionizing energy is performed by the formation of a plasma.

9. A method as recited in claim 8, wherein said formation of a plasma is achieved using electron-cyclotron resonance.

10. A method as recited in claim 8, wherein said formation of a plasma is achieved using inductively coupled high frequency power.

11. A method as recited in claim 10, including the further step of
   magnetically filtering hot electrons from ions extracted from said ion source.

12. A method as recited in claim 1, wherein said step of providing an ion source further comprises locating said ion source with respect to said body of semiconductor material so as to limit arc breakdown.

13. A method as recited in claim 1, wherein said buried layer is formed of a first species of ions of a implanted material implanted at a first depth within said body of semiconductor material comprising the further step of
   implanting a second species of ions of said implanted material at a second depth greater than said first depth within said body of semiconductor material and outside said buried layer.

14. A method as recited in claim 13, wherein said implanted material is oxygen and said first species of ions is $O_2^-$ or $O_2^+$, whereby a semiconductor-on-insulator structure is formed.

15. An apparatus for implanting a material in a body of semiconductor material, said apparatus including
   an ion source,
   means for applying an accelerating voltage field adjacent said ion source,
   additional electrode means to provide a substantially uniform ion beam at said body of semiconductor material, and
   means for controlling said ion source to provide ions only when said acceleration voltage field is present adjacent said ion source.

16. An apparatus as recited in claim 15, further including means for substantially evacuating said ion source, and
   means for introducing substantially pure material into said ion source.

17. An apparatus as recited in claim 15, wherein said means for applying said accelerating voltage includes a grid.

18. An apparatus as recited in claim 17, wherein said ion source is an electron-cyclotron resonance source.

19. An apparatus as recited in claim 17, wherein said ion source is a bucket or multi-pole plasma source.

20. An apparatus as recited in claim 15, wherein said means for applying said accelerating voltage includes an electrode connected to said body of semiconductor material.

21. An apparatus as recited in claim 20, wherein said ion source is an electron-cyclotron resonance plasma source.

22. An apparatus as recited in claim 20, wherein said ion source is a bucket or multi-pole plasma source.

23. An apparatus as recited in claim 15, further including a magnetic filter.

24. An apparatus as recited in claim 15, wherein said means for applying an accelerating voltage implants a first species of ions of a material at a first depth within said body of semiconductor material and a second species of ions of said material at a second depth greater than said first depth within said body of semiconductor material and outside said buried layer.

25. A apparatus as recited in claim 24 wherein said material is oxygen and said first species of ions is $O_2^-$ or $O_2^+$, whereby a semiconductor-on-insulator structure is formed.

* * * * *